Figure 1:
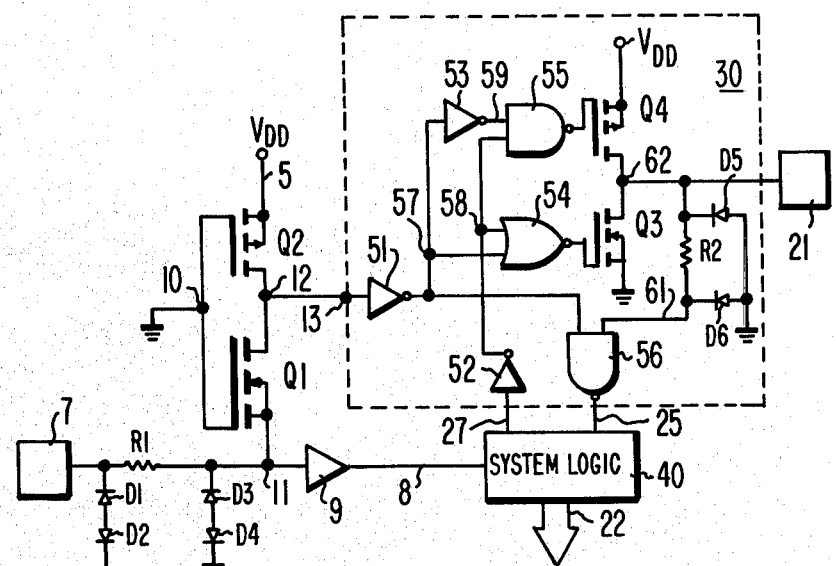

United States Patent [19]

Gillberg

[11] 4,350,906

[45] Sep. 21, 1982

[54] CIRCUIT WITH DUAL-PURPOSE TERMINAL

[75] Inventor: James E. Gillberg, North Plainfield, N.J.

[73] Assignee: RCA Corporation, New York, N.Y.

[21] Appl. No.: 102,574

[22] Filed: Dec. 11, 1979

Related U.S. Application Data

[63] Continuation of Ser. No. 918,653, Jun. 23, 1978, abandoned.

[51] Int. Cl.³ .................. H03K 19/094; H03K 19/20; H03K 19/003; H03K 17/687
[52] U.S. Cl. .................................... 307/469; 307/443; 307/473; 307/585; 307/561
[58] Field of Search ............... 307/443, 448, 451, 473, 307/465, 468, 469, 579, 585, 561, 475, 442

[56] References Cited

U.S. PATENT DOCUMENTS

| | | | |
|---|---|---|---|
| 3,712,995 | 1/1973 | Steudel | 357/42 X |
| 3,832,575 | 8/1974 | Dasgupta et al. | 307/443 |
| 3,832,576 | 8/1974 | Proebsting | 307/473 |
| 3,849,672 | 11/1974 | Georgopoulos | 307/542 X |
| 3,878,405 | 4/1975 | Sylvan | 307/451 X |
| 3,906,255 | 9/1975 | Mensch, Jr. | 307/473 X |
| 3,912,947 | 10/1975 | Buchanan | 307/473 X |
| 3,916,217 | 10/1975 | Shimada et al. | 307/451 |
| 3,935,476 | 1/1976 | Paluck | 307/440 |
| 3,944,848 | 3/1976 | Heeren | 307/448 |
| 3,969,633 | 7/1976 | Paluck et al. | 307/205 |
| 3,980,898 | 9/1976 | Priel | 307/475 X |
| 4,064,405 | 12/1977 | Cricchi | 307/451 |
| 4,158,891 | 6/1979 | Fisher | 307/473 X |
| 4,163,907 | 8/1979 | Schroeder et al. | 307/473 |

FOREIGN PATENT DOCUMENTS 2657948  7/1977  Fed. Rep. of Germany ...... 307/205

OTHER PUBLICATIONS

"3870 Microcomputer Devices Application Note-MK 3870 Series; Microcomputer, Testing, Using the Test Pin," Jul. 1978, by Mostek Corporation, pp. 1 and 2.
"MCS-48 ™ Family of Single Chip Microcomputers," User's Manual, Jul. 1978, by Intel Corporation, Sections 2.4.2 and 2.4.3, pp. 2-18 and 2-19.

Primary Examiner—Larry N. Anagnos
Attorney, Agent, or Firm—E. M. Whitacre; P. J. Rasmussen; P. M. Emanuel

[57] ABSTRACT

A complementary MOS input circuit not only transfers input signal swinging between conventional logic levels in a normal mode but also provides a control signal upon application of an input signal swinging outside the normal range of logic levels. This control signal is then available to be used to change selective connections in an integrated circuit to change its operating function, for example. The input circuit includes first and second complementary MOS transistors arranged like an inverter but having their gates connected to a fixed potential and having input signal potential applied to the source of the first transistor. The transistors exhibit an output signal at the interconnection between their drain electrodes which output changes state on an input swinging past the fixed potential sufficiently to render the first transistor conductive.

6 Claims, 3 Drawing Figures

CIRCUIT WITH DUAL-PURPOSE TERMINAL

This is a continuation of application Ser. No. 918,653, filed June 23, 1978 now abandoned.

This invention relates to digital input circuits with dual-purpose terminals.

Frequently, in designing integrated circuits such as large scale integrated Complementary Metal Oxide Semiconductor, or CMOS, digital circuits fabricated on a monolithic semiconductor die the designer finds himself limited as to the number of package wiring pins. This is referred to as being "pin limited." It is not uncommon that a digital integrated circuit or IC mounted in a package having fewer package pins than the IC has input/output terminals. In such a situation portions of the IC are rendered operational, but the full operating capability of the device cannot be utilized.

Another situation which arises, occurs where the package has a sufficient number of pins to accommodate the IC functional input and output terminals. However, because of the nature of the circuit it would be desirable to access internal portions of the integrated circuit for testing purposes. For example, an IC may be composed of a long digital delay line, which delay line outputs to arithmetic logic. To facilitate testing, injection of a test signal directly into the arithmetic logic rather than running the test signal through the delay line would be advantageous. Such testing, however, requires additional external interconnections which the package may not be capable of providing.

The utility of certain pin-limited integrated circuits may be expanded, or circuit testing facilitated, by making at least one of the IC input connections perform a dual purpose—e.g., accepting a typical logic signal as input signal in one mode, and accepting a control signal used to implement a control function in a second mode. The control signal could, for example, condition a connection otherwise used to supply output signals to receive input or test signals. Or the control signal might be used to cause diversion of an input signal present at an input interconnection from one portion of the integrated circuit function to another portion of the integrated circuit.

The input electrodes of functional CMOS logic elements such as NAND or NOR gates, etc., are typically connected to the gate electrodes of a pair of complementary transistors. The devices are energized by an applied potential of value $V_{DD}$ and typically have input and output logic potential swings equal to $V_{DD}$. The output potential of a logic gate depends upon whether the input potential is greater or less than a particular potential value which is some fraction of $V_{DD}$.

An input potential which further exceeds $V_{DD}$ has no different effect on the logical output than any input potential which exceeds this fraction of $V_{DD}$—e.g., one which equals $V_{DD}$—provided the voltage breakdown characteristics are not exceeded. An input potential of opposite polarity to $V_{DD}$ has no different effect on the logical output of an input potential equal to zero, again assuming no untoward breakdown voltage effects. More particularly, as an example, if a logic gate were energized with a (+)5 volt supply it would logically respond to an input logic signal with potential swing between zero and (+)5 volts. On the other hand, it would not respond to an input logic signal with potential swing zero to (−)5 volts any differently than to a logic signal level of zero volts. Nor would it respond to a logic signal with potential swing of (+)5volts to (+)10 volts any differently than to a logic signal level of (+)5 volts. These phenomenon permit the realization of a dual-purpose input circuit.

A CMOS dual-purpose input circuit embodying the present invention is formed with a pair of complementary MOS transistors having a common drain interconnection. The PMOS transistor of the pair has its source electrode returned to a relatively positive supply potential and has a relatively low conductance compared to the corresponding NMOS transistor. The gate electrodes of both transistors are returned to a relatively negative supply potential. The source electrode of the NMOS transistor interconnects with an input terminal and the input electrode of a conventional CMOS inverter whose output is connected to the system circuitry of the integrated circuit.

A signal which is applied to the input terminal and which has a potential swing between the potentials applied between the gate and source electrode of the PMOS transistor will be transmitted through the CMOS inverter to the system logic to implement normal system function but will have no effect on the aforementioned transistor pair. A control or negative potential outside the normal logic swing for input signal, will when applied to the input terminal, cause the common drain interconnection of the transistor pair to change from a logic "high" to a logic "low" state, which condition is then employed to alter some internal connection of the integrated circuit. The CMOS dual-purpose input circuitry embodying the present invention may also be realized in inverted CMOS wherein the opposite conductivity type substrate is used in which case the input control signal would be of relatively positive polarity and applied to the source electrode of the PMOS rather than the NMOS transistor.

Figure 2:
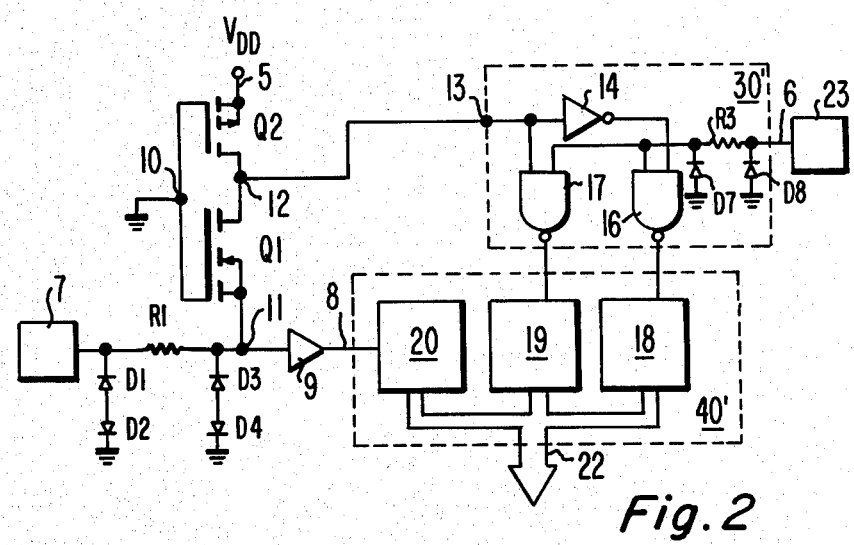
Figure 3:
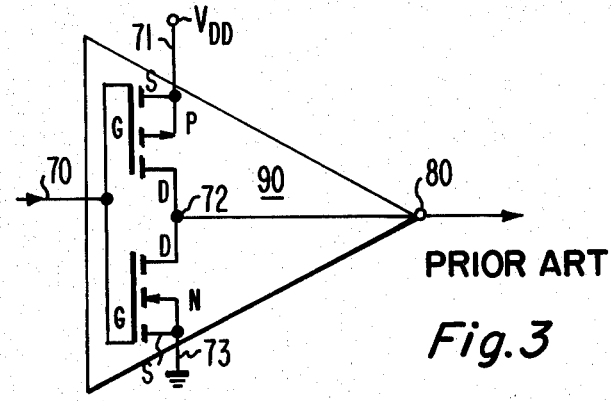

In the drawings:

FIGS. 1 and 2 are schematic diagrams of respective embodiments of the invention showing specific examples of control logic circuitry conjoined with the input structure; and FIG. 3 is a schematic of a prior art CMOS inverter circuit that may be utilized in place of buffer circuit 9 in FIGS. 1 and 2.

Referring to the circuit shown in FIG. 1, pads 7 and 21 are terminals included on a monolithic die by which connection is made between the integrated circuitry on the die and circuitry typically external to the die. In the figures, terminal 7 functions as an input terminal. CMOS input terminals are conventionally provided with protection circuits to prevent potentials exceeding amplitudes capable of causing destructive breakdown being applied to MOS gate structures, e.g. the input of buffer circuit 9. Diodes D1, D2, D3 and D4 and resistor R1 embody one such input protection circuit, the operation of which will be described in detail hereinafter.

Buffer circuit 9 is a device having relatively high input impedance, such as the gate of an MOS transistor, in order that signals outside the range of normal logic potentials may be applied to the input without the signals being clamped or otherwise adversely affected. The buffer circuit is further required to be responsive only to signals swinging within the normal range of logic potentials, i.e., ground potential to $V_{DD}$. These characteristics allow the application of signals to terminal 7 which are more positive than $V_{DD}$ and more negative than ground, the buffer however responding only to voltage excursions between ground and $V_{DD}$. Buffer circuit 9 shown in FIGS. 1 and 2 may be a conventional CMOS inverter circuit as shown in FIG. 3 wherein the input connection is the common gate electrode interconnection of the complementary transistors. In the alternative buffer circuit 9 may be any one of a number of standard logic circuits such as MOS NAND or NOR gate devices wherein their excess input connections are suitably biased to make the device responsive to the input connected at node 11, or it may be some other circuit having the aforementioned input characteristics and which outputs a logic signal responsive to logic signals applied at its input.

Potentials applied to input terminal 7, which are constrained to a particular range of amplitudes, will appear essentially unaffected at node 11. Signals applied to 7 which swing the normal logic potential levels will be transmitted by buffer circuit 9 to system logic 40. System logic for the purpose of this invention is defined as functional circuitry by which the integrated circuit performs the purpose of its design. The system logic need not be of any particular design insofar as the present invention is concerned, except that it is necessary that node 11 be free to swing both positively and negatively. This condition is assured by using 9 to buffer node 11 from the ensuing system logic.

The system logic 40 has additional input/output connections designated 22 and 25 and 27 in the figure. The input/output connections 25 and 27 consist of at least two interconnecting conduction paths between the system logic and peripheral control logic integrated on the monolithic die and designated 30 in the figure. The input/output connections 22 may consist of terminals similar to 7 and 21 with requisite interconnections to logic 40 or it may consist of additional control logic blocks with their attendant interconnections.

Control logic 30 is a functional logic circuit which accepts a control signal at its input 13 to establish a particular relationship between a particulr input/output terminal 21 and the system logic 40. The circuitry circumscribed by the dashed line in the figure is but one example of control logic. This particular control logic 30 conditions terminal 21 to receive logic output signals from the system logic via connection 27 when control input 13 is at a logic high potential, and conditions terminal 21 to apply input logic signals to the system logic via connection 25 when control input 13 is at a logic low potential. FIG. 2 shows a second example of control logic, which logic 30' responsive to a control signal at 13 diverts an input signal at terminal 21 between subsystems 18 and 19 in system logic 40'. Details of the operation of control logic 30 and 30' will be discussed later.

The control signals applied to input 13 of the control logic are developed by transistors Q1 and Q2 being responsive to a particular potential applied to terminal 7.

P-channel field effect transistor Q2 and N-channel field effect transistor Q1, which are usually enhancement mode devices, are conditioned to conduct current between their source and drain electrodes by application of a negative and positive potential respectively between their gate and source electrodes when those potentials exceed their "turn on" or threshold voltage $V_T$. Transistors Q1 and Q2 have their drain electrodes and gate electrodes respectively interconnected at 12 and 10 to form a configuration structurally similar to a conventional CMOS logic inverter. Unlike a conventional logic inverter, input signal is applied to the source electrode of Q1 and the gate electrodes are held at a fixed potential shown as ground. The source electrode of Q2 is connected to a positive fixed potential of amplitude sufficient to maintain Q2 in a condition susceptible of conduction when node 12 is returned to a potential more negative than $V_{DD}$. Q1, having its source electrode connected at 11 and its gate grounded, is nonconducting for potentials applied via resistor R1 to node 11 which fall within the range of normal logic levels—i.e., any potential from ground to $V_{DD}$. Under these normal operating conditions wherein normal logic potentials are applied to terminal 7 and Q2 and Q1 are respectively conducting and nonconducting, node 12 will be in a logic "high" state having a potential essentially equal to $V_{DD}$, sustained by the conduction path through Q2.

NMOS transistor Q1 conducts when its gate-to-source potential is positive by at least its threshold or turn-on voltage $V_{TN}$, which voltage may be realized by causing its source potential to be negative by at least $V_{TN}$. Where Q1 and Q2 are electrically matched devices and negative input signal equal in amplitude to $V_{DD}$ is applied to the source of Q1, the conductances of Q1 and Q2 being the same, electrode 12 will assume a potential of zero volts or a logic low state. On the other hand, if the source potential of Q1 is at some value intermediate to negative $V_{DD}$ and negative $V_{TN}$, electrode 12 will attain a potential intermediate to a logic low of zero volts and a logic high of $V_{DD}$ volts. It may not be practical to apply a potential as large as negative $V_{DD}$ to 11 to achieve a logic low at 12 due to potential breakdown parameters of the integrated structure. A logic low of zero volts at 12 may be realized with a lesser absolute potential on 11 by increasing the conductance of Q1 relative to Q2.

The channel conductance of an enhancement mode MOS transistor which is operating in saturation, wherein its drain-source potential is greater than or equal to its gate-source potential plus a threshold potential, is a function of physical parameters and the applied gate-source potential. The first order equation defining drain current is given by $I_d = K(V_{gs} - V_T)^2$ where $V_{gs}$ is the gate-to-source potential and K is a conductance factor incorporating dimensional parameters and physical constants. The dimensional parameters of the transistor include the width and length of the conducting channel of the device, which parameter values are selected by the device designer to establish desired conductance characteristics. The output potential at the common drain interconnection of a pair of series-connected complementary MOS transistors which are simultaneously conducting is determined by the ratio of their dimensional parameters and their gate-source potentials. In particular for a given potential $V_{11}$ at node 11 the ratio of the conductance factors K of Q1 and Q2 required to establish a logic low at 12 is determined by the relationship $\sqrt{K_1/K_2} = (V_{DD} - V_{TP})/(V_{11} - V_{TN})$ where $K_1$, $V_{TN}$ and $K_2$, $V_{TP}$ are the conductance factors and threshold voltage values of Q1 and Q2, respectively.

One may then design Q1 such that the potential at node 12 can be made to change to a low state by application of a potential to terminal 11 which is just slightly more negative than one NMOS threshold potential. Any potential more positive than $(-)V_{TN}$ applied to 11 will turn Q1 off causing 12 to assume a logical high state.

Incorporating buffer circuit 9 into the input circuit insures that node 11 is connected to a high impedance interface with respect to the system logic, i.e. the gate electrodes of the transistors comprising 9. It is important that node 11 not be indiscriminately connected to the system logic as connection to an n-type diffusion, for example, might clamp the negative potential swing at 11 and render the circuit inoperable.

Terminal 7 can be used to input a logic signal to the system logic through buffer circuit 9 in a normal mode, or to alter the system function in a second mode. The control signal developed at node 12 has been described in terms of a relatively constant or dc signal, but is not restricted to this. A negative pulse train applied to terminal 7 will produce a logical pulse train at 12, which pulse train may be applied directly to the system logic or the control logic. In particular, the terminal can input signals to different locations of a logic system in alternate modes. Logic signals at 7 swinging from 0 volts to $V_{DD}$ are available at 8 for application to one system input whereas logic signals swinging from ground to a negative potential are level shifted by transistors Q1 and Q2 and available at 12 for application to a second system input. The system would be required to accommodate receiving the signals at the two inputs at alternate time periods.

Diodes D1, D2, D3, D4 with resistor R1 form a clamping or protection circuit to limit the potential at node 11. The gate electrodes of CMOS inverter pairs, e.g. the input of buffer circuit 9, are susceptible to destructive breakdown caused by static electrical charge. Conventional practice is to provide all external input interconnections with circuit elements to dissipate the static charge and its attendant potential before it can affect MOS transistor gate electrodes. Diodes D1-D4 integrated on the monolithic die, have similar electrical characteristics and an avalanche breakdown potential of approximately 7 volts, for example. A potential at 7, exceeding (+) or (−)7 volts will cause D1 or D2 respectively to avalanche and dissipate charge. Resistor R1 and diodes D3 and D4 provide additional dissipating means and further protection especially from the application of potential impulses applied at 7 resulting from static charge. This particular protection circuit permits the input to swing above and below ground potential.

Control logic 30 shown in FIG. 1 operates in the following manner. Application of a logic high potential at control signal node 13 imposes a logic low potential at interconnection 57 through the action of inverter 51. A logic low on 57, applied to a first input of two-input NAND gate 56 causes the output of 56 to remain in a logic high state regardless of the potential at its second input 61. Conversely, a logic high on 57 will cause signals at the output of NAND gate 56 to be complements of the logic signals applied to 61, in which case terminal 21 can be used for applying input signals to the system logic 40.

The low potential on 57 applied to the NOR gate 54 and its complement at connection 59 of NAND gate 55 concurrently condition 55 and 54 to transmit like signals, received from system logic 40 via inverter 52 and connection 58, to the gate electrodes of series-connected complementary PMOS transistor Q4 and NMOS transistor Q3, selectively conditioning one or the other to conduct. That is Q3 and Q4 are conditioned to operate like the complementary-conductivity output transistors in a conventional CMOS inverter device and so pass a replica of the signal appearing at 27 to terminal 21.

Alternatively, with a low logic potential at 13 and a high and low respectively at connections 57 and 59, the outputs of 55 and 54 are locked in a high and low state respectively causing both Q3 and Q4 to be in an off state and presenting essentially infinite impedance at node 62. In such a condition Q3 and Q4 are essentially disconnected from terminal 21, allowing it to be used as an input terminal concurrent with NAND gate 56 being conditioned to receive signal on its input 61.

Diodes D5 and D6 and resistor R2 form an input protection network for the second input 61 of NAND gate 56. Resistor R2 is a p-type diffused resistor disposed in an n-type substrate forming a pn junction therein. The substrate is typically biased at $V_{DD}$. The junction thus formed forward biases when the potential at 21 exceeds $V_{DD}$ while D5 and D6 forward bias when the potential at 21 is more negative than ground potential. The potential at 61 and 21 is clamped between the limits of $V_{DD}$ and ground at least within one diode offset potential drop by the protection circuit.

The control logic 30' shown in FIG. 2 causes an input signal appearing at terminal 23 to be selectively applied to system logic subsystem 18 or 19. In the circuit, inverter 14 applies the complement of the logic level applied to input 13 onto connection 15 so that either NAND gate 16 or 17 must have a high logic level on one of their respective first inputs. Their respective second inputs are connected via a protection circuit to input terminal 23. A low logic level appearing at input 13 and therefore the first input of NAND 17 locks the output of NAND 17 in a high state causing it to be nonresponsive to any signal applied to its second input from terminal 23. The first input of NAND gate 16 however is concurrently high due to the inversion of the signal at 13 by inverter 14 conditioning NAND gate 16 to respond to signal applied to its second input from terminal 23 and to apply the complement of this signal to circuit function 18. Conversely, a high logic potential applied to 13 conditions NAND gate 17 to be responsive to a signal at terminal 23 and to apply the complement at this signal to circuit function 19, while NAND 16 is locked into a high output state.

The circuit of FIG. 3 is a conventional CMOS inverter circuit 90 which may be employed as the buffer circuit 9 in FIGS. 1 and 2. This circuit includes a PMOS transistor having its source electrode 71 connected to $V_{DD}$, an NMOS transistor having electrical characteristics complementary to the PMOS transistor and having its source electrode 73 connected at ground, or some potential more negative than $V_{DD}$. The two transistors have their drain electrodes interconnected with an output terminal 80 and their gate electrodes interconnected with an input terminal 70.

Application of a logic low, or logic high to the input 70 respectively causes the circuit to produce a logic high or logic low at the output 80. With respect to the input of 90 a logic low is a potential more negative than one n-type threshold potential above the potential applied to the source of the NMOS transistor. A logic high is a potential more positive than one p-type threshold potential more negative than $V_{DD}$.

The invention has been described primarily in terms of CMOS technology but may in fact be realized in single channel NMOS or PMOS technology wherein the buffer circuits and logic gates would be designed as is commonly known to one skilled in the art. Whether single channel MOS or complementary MOS technology is employed transistor Q2 may be replaced by some other suitable load means such as a resistor or a number of series-connected diodes for example since transistor Q2, in the circuit, is operated as an active load for transistor amplifier Q1.

The invention is not intended to be restricted to the embodiments shown. Numerous alternatives will occur to one skilled in the art armed with the foregoing description. It is to be understood that numerous changes and modifications may be resorted to without departing from the spirit of the invention, and the following claims should be considered accordingly.

What I claim is:

1. A circuit comprising:
   a first dual-purpose terminal;
   a first field effect transistor of a first conductivity type having gate and drain and source electrodes;
   a second terminal for receiving a first supply potential, and means connecting said second terminal to the gate electrode of said first field effect transistor;
   a third terminal for receiving a second supply potential;
   a second field effect transistor of a conductivity type complementary to said first transistor and having gate and source electrodes connected respectively to said second and said third terminals and having a drain electrode connected to the drain electrode of said first field effect transistor, said second field effect transistor conditioning said first field effect transistor for conduction between its source and drain electrodes;
   a fourth terminal connected to the interconnection of the drain electrodes of said first and second field effect transistors from which a control signal is available;
   system logic circuitry having first and second inputs and an output and being of a type responsive to logic signals swinging over a range between said first and second supply potentials, which logic signals are applied to its inputs;
   means capable of passing a logic signal swinging over a range between said first and second supply potentials, connecting said first terminal to the first input of said system logic circuitry;
   means connecting said first terminal to the source electrode of said first field effect transistor which connecting means is capable of passing a potential of such polarity and amplitude to condition said first field effect transistor for conduction to generate said control signal;
   a fifth, or other dual-purpose terminal, from which signals are selectively applied or received;
   third and fourth field effect transistors respectively of the same conductivity types as said first and second field effect transistors and having respective gate and drain and source electrodes;
   means connecting the drain electrodes of said third and fourth field effect transistors to said fifth terminal;
   means connecting the source electrodes of said third and fourth field effect transistors to said second and third terminals respectively; and
   control logic circuitry having a control signal input terminal connected to said fourth terminal and having a plurality of signal paths respectively coupled between said fifth terminal and said second input of said system logic circuitry and said output of said system logic circuitry and the gate electrodes of said third and fourth field effect transistors, which signal paths are selectively conditioned to pass signal upon application of said control signal to said control signal input terminal, said control logic circuitry causing a logic signal developed at said output of said system logic circuitry to control the conduction of said third and fourth field effect transistors when said control signal has a first level, and said control logic circuitry causing a logic signal developed at said fifth terminal to control the logic signal developed at said second input of said system logic circuitry and simultaneously causing said third and fourth field effect transistors to be rendered non-conductive when said control signal has a second level.

2. A circuit having a dual-purpose terminal as set forth in claim 1 wherein said control logic circuitry comprises:
   a first logic inverter circuit having an input connected to said output connection of said system logic output terminal and having an output;
   a second logic inverter circuit having an input connected to said control logic input terminal and having an output;
   first and second NAND gates respectively having respective first and second inputs and having respective outputs;
   a NOR gate having first and second inputs and an output;
   a third logic inverter circuit having an input connected to an interconnection of the first inputs of said first NAND and said NOR gates and the output of said second logic inverter circuit, and having an output connected to the first input of said second NAND gate;
   means connecting the second inputs of said NOR and said second NAND gates to the output of said first logic inverter circuit;
   means connecting the gate electrodes of said third and fourth field effect transistors respectively to the outputs of said NOR and said second NAND gate for conditioning said third and fourth field effect transistors to function as a logic inverter circuit responsive to the logic signal developed at said system logic output when a logic high is simultaneously present at said control signal input terminal and for rendering said third and fourth field effect transistors non-conductive when a logic low is simultaneously present at said control signal input terminal; and
   means connecting said fifth terminal to the second input of said first NAND gate for applying signal thereto, which gate responds to signals applied to its second input when a logic low is simultaneously present at said control signal input terminal;
   means connecting the output of said first NAND gate to said second input of said system logic circuitry for applying input signals thereto.

3. A circuit having a dual purpose terminal as set out in claim 2 wherein the means connecting said fifth terminal to the second input of said first NAND gate comprises an input protection circuit series-connected between said input and said fifth terminal, for limiting the amplitude of signals passed by said protection circuit to potentials essentially ranging between said first and second supply potentials.

4. A circuit having a dual-purpose terminal as set forth in claim 1 wherein the means connecting said first terminal to said first input of said system logic circuitry comprises:

an input protection circuit, which protection circuit passes potentials both positive and negative with respect to said first supply potential and limiting the positive and negative amplitudes to prescribed potentials.

5. A circuit having a dual purpose terminal as set forth in claim 4 wherein said protection circuit comprises:

a resistive means having a first end connected to said first terminal and a second end connected to the input of said system logic circuitry;

first, second, third and fourth diode means having similar avalanche breakdown potentials;

means serially connecting said first and second diode means in a first selectively conductive path between the first end of said resistive means and said second terminal, said diodes poled to exhibit avalanche breakdown for opposite directions of current flow in said first selectively conductive path;

means connecting the third and fourth diode means in a second selectively conductive path between the second end of said resistive means and said second terminal and poled to exhibit avalanche breakdown for opposite directions of current flow in said second selectively conductive path.

6. A circuit with a dual-purpose terminal as set forth in claim 1 wherein said means connecting said first terminal to said first input of said system logic circuitry comprises:

fifth and sixth field effect transistors, the second transistor being of the same conductivity type as the first transistor, the third transistor being of complementary conductivity type to the first transistor, said fifth and sixth field effect transistors each having respective gate and drain and source electrodes;

means connecting said fifth and sixth field effect transistors as a logic inverter circuit including a connection of their gate electrodes to said first terminal; a connection of their drain electrodes to said first input of said system logic circuitry, a connection of the source electrodes of said fifth and sixth field effect transistors to said second and third terminals respectively.

* * * * *